(12) United States Patent
Bernhardt (10) Patent No.: US 10,607,695 B2
(45) Date of Patent: *Mar. 31, 2020

(54) PROVISION OF STRUCTURAL INTEGRITY IN MEMORY DEVICE

(71) Applicant: INTEL CORPORATION, Santa Clara, CA (US)

(72) Inventor: Michael J. Bernhardt, Boise, ID (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/770,491

(22) PCT Filed: Sep. 6, 2016

(86) PCT No.: PCT/US2016/050448
§ 371 (c)(1),
(2) Date: Apr. 23, 2018

(87) PCT Pub. No.: WO2017/091276
PCT Pub. Date: Jun. 1, 2017

(65) Prior Publication Data
US 2019/0057736 A1    Feb. 21, 2019

Related U.S. Application Data

(63) Continuation-in-part of application No. 14/950,837, filed on Nov. 24, 2015, now Pat. No. 9,608,202.

(51) Int. Cl.
| | | |
|---|---|---|
| *G11C 13/00* | (2006.01) | |
| *H01L 27/24* | (2006.01) | |
| *H01L 45/00* | (2006.01) | |
| *H01L 27/11526* | (2017.01) | |
| *H01L 27/22* | (2006.01) | |

(52) U.S. Cl.
CPC ...... *G11C 13/0007* (2013.01); *G11C 13/0021* (2013.01); *H01L 27/11526* (2013.01);
(Continued)

(58) Field of Classification Search
CPC .................................................. H01L 27/2481
See application file for complete search history.

(56) References Cited

U.S. PATENT DOCUMENTS

| | | |
|---|---|---|
| 7,501,153 B2 | 3/2009 | Yamada et al. |
| 8,802,561 B1 | 8/2014 | Yeh et al. |

(Continued)

OTHER PUBLICATIONS

International Search Report and Written Opinion, dated Dec. 16, 2016, issued in corresponding International Application No. PCT/US2016/050448, 12 pages.

(Continued)

*Primary Examiner* — Mounir S Amer
(74) *Attorney, Agent, or Firm* — Schwabe, Williamson & Wyatt, P.C.

(57) ABSTRACT

Embodiments of the present disclosure are directed towards techniques to provide structural integrity for a memory device comprising a memory array. In one embodiment, the device may comprise a memory array having at least a plurality of wordlines disposed in a memory region of a die, and a first fill layer deposited between adjacent wordlines of the plurality of wordlines in the memory region, to provide structural integrity for the memory array. At least a portion of a periphery region of the die adjacent to the memory region may be substantially filled with a second fill layer that is different than the first fill layer. Other embodiments may be described and/or claimed.

9 Claims, 9 Drawing Sheets

(52) U.S. Cl.
CPC ...... *H01L 27/2481* (2013.01); *H01L 45/1253* (2013.01); *H01L 45/145* (2013.01); *G11C 13/003* (2013.01); *G11C 2213/71* (2013.01); *G11C 2213/76* (2013.01); *G11C 2213/81* (2013.01); *H01L 27/224* (2013.01); *H01L 27/2409* (2013.01); *H01L 2224/16225* (2013.01)

(56) References Cited

U.S. PATENT DOCUMENTS

| | | |
|---|---|---|
| 9,608,202 B1 | 3/2017 | Bernhardt |
| 9,685,507 B2 * | 6/2017 | Basker ............... H01L 29/0649 |
| 2009/0268500 A1 | 10/2009 | Fang et al. |
| 2013/0043521 A1 | 2/2013 | Jung |
| 2013/0249050 A1 | 9/2013 | Mathew et al. |
| 2014/0061748 A1 | 3/2014 | Lee |
| 2014/0291604 A1 | 10/2014 | Pellizzer et al. |
| 2014/0308786 A1 | 10/2014 | Lee et al. |
| 2015/0035068 A1 | 2/2015 | Huang et al. |

OTHER PUBLICATIONS

Non-Final Office Action dated Jul. 29, 2016, issued in related U.S. Appl. No. 14/950,837, 13 pages.
Notice of Allowance dated Nov. 18, 2016, issued in related U.S. Appl. No. 14/950,837, 8 pages.
Extended European Search Report dated Jan. 29, 2020 for EP Application No. 16869023.8, 9 pages.

* cited by examiner

PROVISION OF STRUCTURAL INTEGRITY IN MEMORY DEVICE

CROSS REFERENCE TO RELATED APPLICATIONS

The present application is a national phase entry under 35 U.S.C. § 371 of International Application No. PCT/US2016/050448, filed Sep. 6, 2016, entitled "PROVISION OF STRUCTURAL INTEGRITY IN MEMORY DEVICE," which claims priority to U.S. application Ser. No. 14/950,837, filed Nov. 24, 2015, and now U.S. Pat. No. 9,608,202. The disclosures of the which are hereby incorporated by reference and for all purposes.

FIELD

Embodiments of the present disclosure generally relate to the field of integrated circuits (IC), and more particularly, to fabrication techniques for a non-volatile memory device.

BACKGROUND

A typical flash memory device may comprise a memory array that includes a large number of non-volatile memory cells arranged in row and column fashion. In recent years, vertical memory, such as three-dimensional (3D) memory has been developed in various forms, such as NAND, cross-point, or the like. A 3D flash memory array may include a plurality of memory cells stacked over one another. Each group of memory cells may share a plurality of access lines, known as wordlines (WLs) and bitlines (BLs).

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In a memory device fabrication, a memory array including access lines (e.g., wordlines) may be etched in a memory region of a die, and connectivity with circuitry may be provided through an adjacent periphery region of a die. The memory array fabrication may include a number of operations, including filling gaps between the wordlines (or bitlines) etched in a die, with a dielectric fill material, in order to provide desired structural integrity for a memory device. Typically, the dielectric fill material may include organic spin-on dielectric (CSOD) material. When such material is deposited to the memory region of the die, it may also fill the adjacent periphery region of the die. However, provision of the organic SOD material to the periphery of the die may cause a number of integration issues, such as undesired dry etch rate and dry strip rate, rip-outs of the material (e.g., during the polishing step of the fabrication process), inadequate adhesion of the material, defects in the interconnects in the periphery area, or the like.

Embodiments of the present disclosure describe techniques and configurations for a memory device comprising a memory array having at least a plurality of wordlines disposed in a memory region of a die. A first fill layer may be deposited between adjacent wordlines of the plurality of wordlines in the memory region, to provide structural integrity for the memory array. At least a portion of a periphery region of the die adjacent to the memory region may be substantially filled with a second fill layer that is different than the first fill layer. The first fill layer may comprise organic (e.g., carbon-based) spin-on dielectric material (CSOD). The second fill layer may comprise a different dielectric material, such as, for example, inorganic dielectric material.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Figure 1:
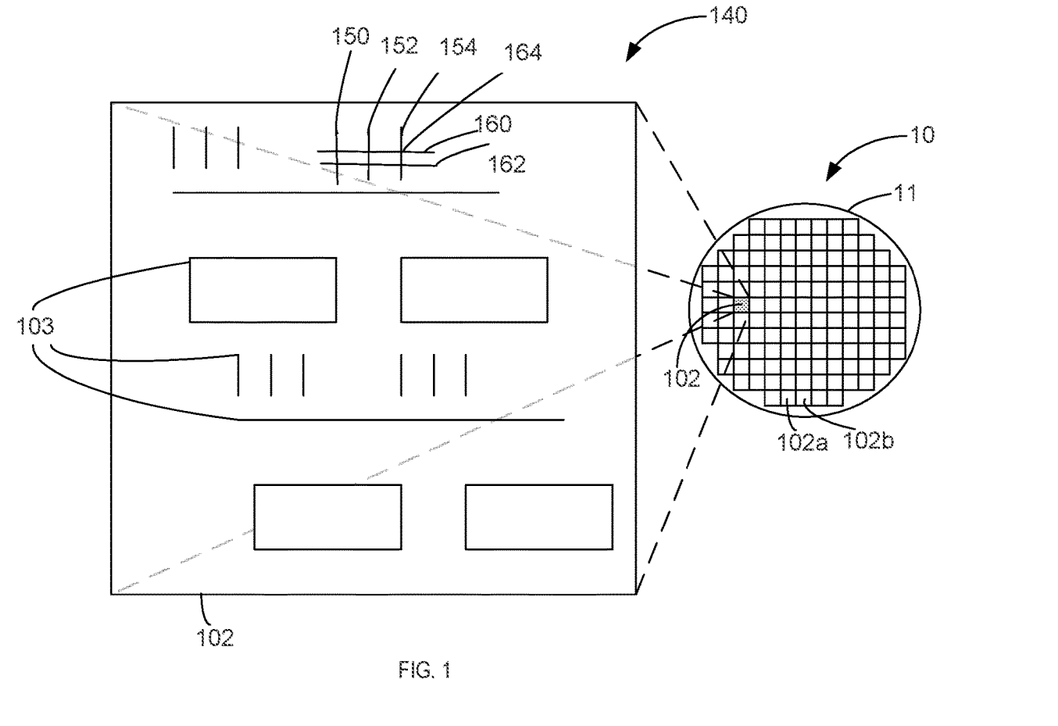
FIG. 1 illustrates an example die in which a memory device may be provided using the techniques of the present disclosure, in accordance with some embodiments.

FIG. 1 illustrates an example die in which a memory device may be provided using the techniques of the present disclosure, in accordance with some embodiments. More specifically, FIG. 1 schematically illustrates a top view of die 102 in wafer form 10 and in singulated form 140, in accordance with some embodiments. In some embodiments, the die 102 may be one of a plurality of dies (e.g., die 102, 102a, 102b) of a wafer 11 composed of semiconductor material such as, for example, silicon or other suitable material. The plurality of dies may be formed on a surface of the wafer 11. Each of the dies may be a repeating unit of a semiconductor product that may include a memory device as described herein. For example, the die 102 may include circuitry 103 of a memory device in accordance with some embodiments. According to various embodiments, the circuitry 103 may include one or more memory elements (cells), which may be configured in an array, such as a two-dimensional (2D) or three-dimensional (3D) non-volatile memory array. In some embodiments, the memory array may comprise a cross-point memory array. The memory elements may include, for example, phase change memory (PCM) elements, resistive random-access memory (RRAM) elements, spin-transfer torque magnetic random-access memory (STTRAM) elements or other suitable devices. The circuitry 103 may further include memory element access devices, or switches, such as, for example, an ovonic threshold switch (OTS), threshold vacuum switch, silicon or oxide based P-N diode, or other switching devices configured for use in selection/programming operations of the memory elements.

The circuitry 103 may further include one or more wordlines (e.g., 150, 152, 154) and one or more bitlines (e.g., 160, 162) coupled to the memory elements. Only three wordlines and two bitlines are shown in FIG. 1 for ease of understanding. In some embodiments, the bitlines and wordlines may be configured such that each of the memory elements may be disposed at an intersection (e.g., 164) of each individual bitline and wordline (e.g., 160 and 154), in a cross-point configuration. A voltage or bias can be applied to a target memory element of the memory elements using the wordlines and the bitlines to select the target memory cell for a read or write operation. Bitline drivers may be coupled to the bitlines and wordline drivers may be coupled to the wordlines to facilitate decoding/selection of the memory elements. To enable memory cell selection, the wordlines 150, 152, 154 may be connected with memory cells and other parts of circuitry 103 via interconnects, including respective contact structures (e.g., vias) that provide electrical connectivity through the layers of the die 102 as described below in greater detail. It is noted that the circuitry 103 is only schematically depicted in FIG. 1 and may represent a wide variety of suitable logic or memory in the form of circuitry or other suitable devices and configurations including, for example, one or more state machines including circuitry and/or instructions in storage (e.g., firmware or software) configured to perform actions such as read, program, verify and/or analysis operations.

In embodiments, the one or more wordlines (e.g., 150, 152, 154) may be located in a memory region of a die 102. Further, a first fill layer may be deposited between adjacent wordlines of the plurality of wordlines (e.g., 150, 152, 154) in the memory region, to provide structural integrity for the memory array. Additionally, at least a portion of a periphery region of the die 102 adjacent to the memory region may be substantially filled with a second fill layer that is different than the first fill layer. These and other aspects will be further described below.

In some embodiments, the circuitry 103 may be formed using suitable semiconductor fabrication techniques, some of which are described herein. After a fabrication process of the semiconductor product is complete, the wafer 11 may undergo a singulation process in which each of the dies (e.g., die 102) may be separated from one another to provide discrete "chips" of the semiconductor product. The wafer 11 may be any of a variety of sizes. According to various embodiments, the circuitry 103 may be disposed on a semiconductor substrate in wafer form 10 or singulated form 140. In some embodiments, the die 102 may include logic or memory, or combinations thereof.

Figure 2:
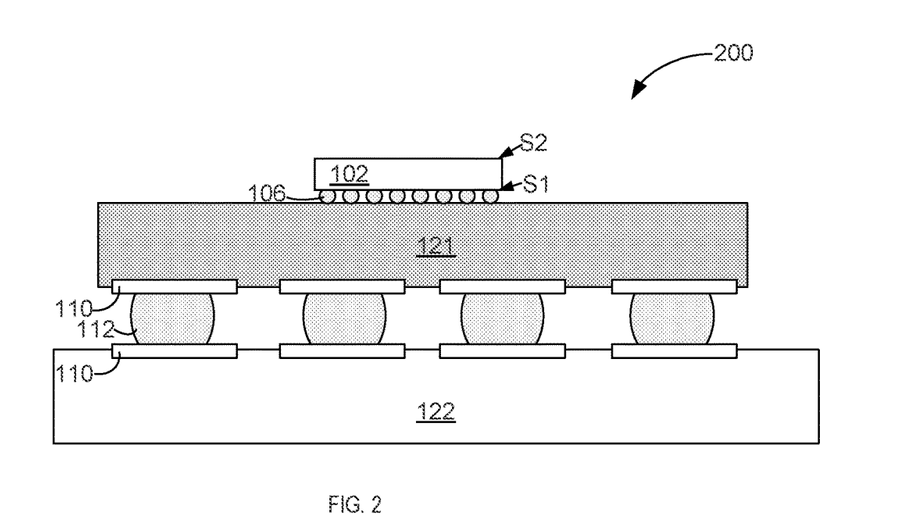
FIG. 2 schematically illustrates a cross-section side view of an integrated circuit (IC) assembly that may include a memory device provided using the techniques of the present disclosure, in accordance with some embodiments.

FIG. 2 schematically illustrates a cross-section side view of an integrated circuit (IC) assembly 200 that may include a memory device provided in accordance with some embodiments described herein. In some embodiments, the IC assembly 200 may include one or more dies (e.g., die 102 of FIG. 1) electrically and/or physically coupled with a package substrate 121. In some embodiments, the die 102 may be, include, or be a part of an IC including a memory, processor, System on chip (SoC) or application-specific integrated circuit (ASIC). For example, the die 102 may include circuitry (e.g., circuitry 103 of FIG. 1) such as a memory device as described herein. The die 102 may represent a discrete product made from a semiconductor material (e.g., silicon) using semiconductor fabrication techniques such as thin film deposition, lithography, etching and the like used in connection with forming memory devices. In some embodiments, an electrically insulative material such as, for example, molding compound or underfill material (not shown) may encapsulate at least a portion of the die 102 and/or die-level interconnect structures 106.

The IC assembly 200 may include a wide variety of configurations including, for example, suitable combinations of flip-chip and/or wire-bonding configurations, interposers, multi-chip package configurations including System in Package (SiP) and/or Package on Package (PoP) configurations. For example, the die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include circuitry such as, for example, memory elements as described in reference to FIG. 1. An inactive side, S2, may be disposed opposite to the active side S1, as can be seen. In other embodiments, the die 102 may be disposed on another die that is coupled with the package substrate 121 in any of a variety of suitable stacked die configurations. For example, a processor die may be coupled with the package substrate 121 in a flip-chip configuration and the die 102 may be mounted on the processor die in a flip-chip configuration and electrically coupled with the package substrate 121 using through-silicon vias (TSVs) formed through the processor die. In still other embodiments, the die 102 may be embedded in the package substrate 121 or coupled with a die that is embedded in the package substrate 121. Other dies may be coupled with the package substrate 121 in a side-by-side configuration with the die 102 in other embodiments.

In some embodiments, the die-level interconnect structures 106 may be configured to route electrical signals between the die 102 and the package substrate 121. The electrical signals may include, for example, input/output (I/O) signals and/or power/ground signals that are used in connection with operation of the die. The die-level interconnect structures 106 may be coupled with corresponding die contacts disposed on the active side S1 of the die 102 and corresponding package contacts disposed on the package substrate 121. The die contacts and/or package contacts may include, for example, pads, vias, trenches, traces and/or other suitable contact structures, fabrication of some of which is described below.

In some embodiments, the package substrate 121 may comprise an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, package contacts (e.g., pads 110) disposed on one or more surfaces of the package substrate 121 and/or internal routing features (not shown) such as, for example, trenches, vias or other interconnect structures to route electrical signals through the package substrate 121.

In some embodiments, the package substrate 121 may be coupled with a circuit board 122, as can be seen. The circuit board 122 may be a printed circuit board (PCB) composed of an electrically insulative material such as an epoxy laminate. For example, the circuit board 122 may include electrically insulating layers composed of materials that may be laminated together. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 may be a motherboard and may be included in a computing device, such as, for example, a mobile device.

Package-level interconnects such as, for example, solder balls 112 may be coupled to pads 110 on the package substrate 121 and/or on the circuit board 122 to form corresponding solder joints that may be configured to further route the electrical signals between the package substrate 121 and the circuit board 122. The pads 110 may be composed of any suitable electrically conductive material such as metal. The package-level interconnect may include other structures and/or configurations including, for example, land-grid array (LGA) structures and the like.

In embodiments, the die 102 of the IC assembly 200 may be, include, or be a part of an IC including a memory device as described herein. The process of fabrication of a memory device comprising circuitry 103 in a die, such the die 102, according to the techniques of the present disclosure is described in reference to FIGS. 3-18.

FIGS. 3-18 schematically illustrate example cross-section side views of a memory device, showing different stages of forming a memory array in a die, in accordance with some embodiments. It will be understood that various features of a memory device, e.g., electrical routing features, interconnect structures, and the like, that may be formed in the memory device manufacturing process, are not shown in FIGS. 3-18 for ease of understanding. Also for ease of understanding, the like elements of the memory device depicted in FIG. 3-18 are enumerated with like numerals. The fabrication process of a memory device is described in application to the wordline formation in the memory array. It is noted that a similar process may be applied to fabrication of bitlines of the memory array and is omitted herein for brevity.

Figure 3:
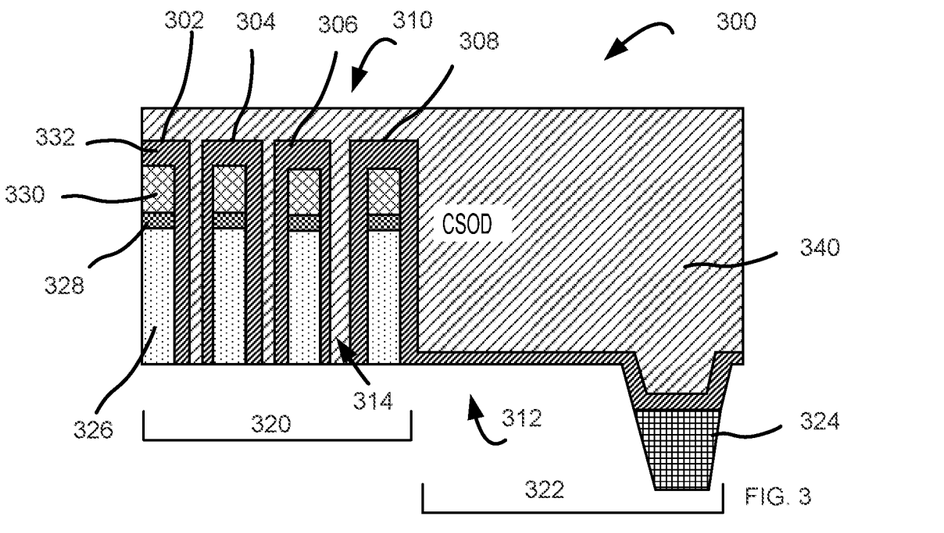
FIGS. 3-18 schematically illustrate example cross-section side views of a memory device, showing different stages of forming a memory array in a die, in accordance with some embodiments.

Referring to FIG. 3, a memory device 300 is depicted subsequent to forming a plurality of wordlines 302, 304, 306, 308 comprising at least in part a memory array 310 in a die 312. As shown, the memory device 300 is further depicted subsequent to a deposition of a fill layer 340 on the memory array 310 to ensure structural integrity of the memory array 310. Only four wordlines of the plurality of wordlines are depicted in FIG. 3 (and subsequent FIGS. 4-18) for ease of understanding.

As shown, the memory array 310 may be disposed in a memory region 320 of the die 312. The die 312 may further include a periphery region 322 located adjacent to the memory region 320, as shown. The periphery region 322 may be used for provision of interconnects between the memory array 310 and circuitry of the IC comprising the memory device, such as circuitry 103 described in reference to FIG. 1. One of such interconnects, a via 324 comprising tungsten, is shown in FIG. 3 for illustration purposes. The wordlines may be provided by various processes, such as dry etch, cleaning, deposition of a liner, and provision of a fill layer for structural integrity purposes. Accordingly, a wordline, such as wordline 302, may include a cell stack 326, a carbon layer 328, a hard mask layer (e.g., silicon nitride) 330, and a sealing layer 332.

A fill layer 340 may be deposited on the memory region 320 and periphery region 322 of the die 312, to provide structural integrity for the memory array 310. In conventional solutions, the fill layer 340 may include a dielectric material, such as inorganic spin-on dielectric, oxide dielectric film or alkoxide compound material, such as tetraethyl orthosilicate (TEOS), or the like. However, the use of the above-mentioned materials may cause unwanted voids in the array 310, for example, in gaps between the wordlines. In order to avoid the voids and provide desired structural integrity for the memory array 310, organic spin-on dielectric material, such as a carbon-rich oxide film (hereinafter CSOD) may be used as a fill layer 340 in the memory region 320. As shown, the fill layer 340 comprising CSOD may be deposited to fill the gaps between the wordlines, such as gap 314 between the wordlines 306 and 308, to provide desired structural integrity of the memory array 310.

Figure 4:
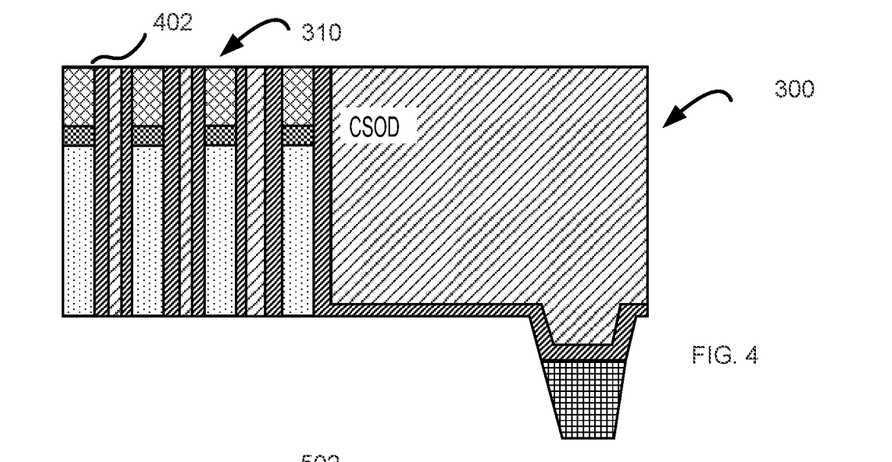

In FIG. 4, the memory device 300 is depicted subsequent to polishing the fill layer 340 (CSOD). The polishing, such as chemical mechanical planarization (CMP), may be provided in order to planarize CSOD substantially to the top 402 of the memory array 310. As shown, the polishing may result in partial or complete removal of the sealing layer 332 from the top of the wordlines of the memory array 310. Different planarization techniques may be used in addition or in the alternative to CMP, such as CMP and dry etch back, for example. After planarization, the top 402 of the memory array 310 may be cleaned to remove unwanted particles.

As shown in FIGS. 3-4, the deposition of the fill layer 340 (CSOD) may result in the provision of the fill layer in the memory region 320 and periphery region 322 of the die 312. However, the presence of the CSOD in the periphery region 322 of the die 312 may cause reliability issues, such as high dry etch rate and dry strip rate, rip-outs, inadequate adhesion, outgassing, defects in the interconnects, or the like. The techniques of the present disclosure described in reference to FIGS. 5-18 may provide for mitigation or elimination of unwanted effects that may be caused by the presence of CSOD in the periphery region 322 of the die 312.

Figure 5:
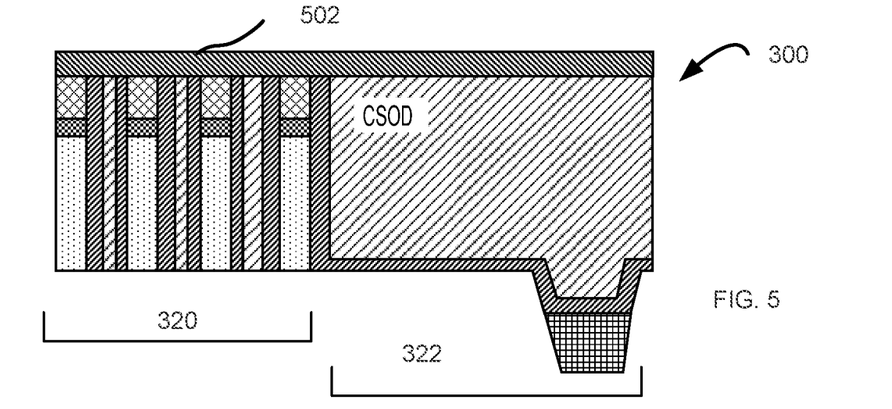

In FIG. 5, the memory device 300 is depicted subsequent to depositing a capping layer 502 on top of the memory device 300, more specifically, on top of the array 310 in the memory region 320, and periphery region 322 of the die 312. The capping layer 502 may include a silicon nitride (SiN), deposited by chemical vapor deposition (CVD), about 20-30 nm thick. The thickness of the capping layer 502 may be based on CMP for the ability to polish the memory array 310 with sufficient over/under polish margin. In some embodiments, the capping layer 502 may be any low temperature film (e.g., below 320 C), including, but not limited to, oxide, polymer, titanium nitride (TiN), or the like.

Figure 6:
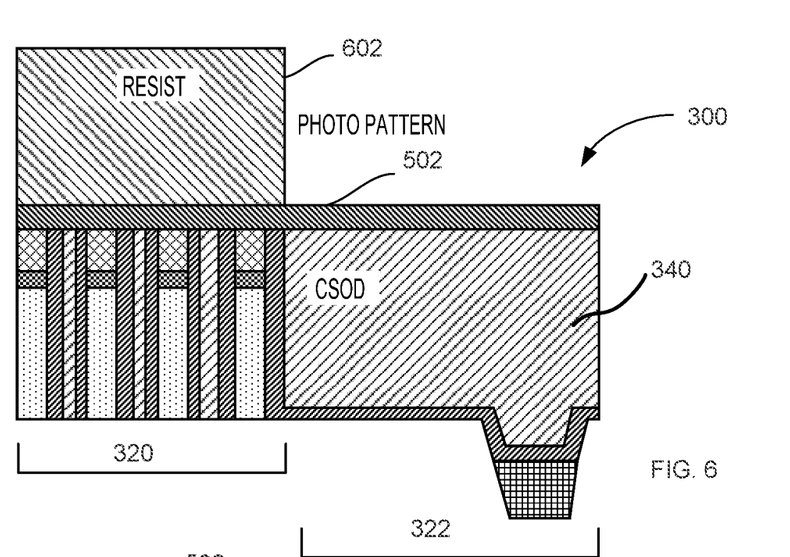

In FIG. 6, the memory device 300 is depicted subsequent to photo patterning of the memory array 310, which may result in a deposition of a resist layer 602 on top of the memory array 310, e.g., on top of the portion of capping layer 502 that substantially covers the memory region 320 of the die 312.

Figure 7:
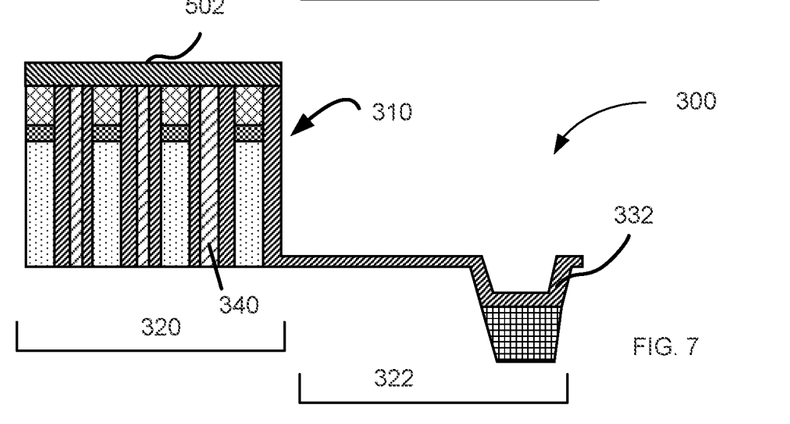

In FIG. 7, the memory device 300 is depicted subsequent to removing the fill layer 340 (CSOD) from the periphery region 322 of the die 312. The fill layer 340 (CSOD) may be removed by dry etch used to etch the capping layer 502 from the periphery region 322, and then removing the exposed fill layer 340 (CSOD) from the periphery region 322, followed by a removal of the resist layer 602. As a result, capping layer 502 over the memory region 320 (e.g., memory array 310) may be exposed. Capping layer 502 may be etched using standard dry etch chemistry, based on capping layer type. CSOD may be etched by using CHxFy, fluorine-based, and/or oxygen rich chemistry. The etch method may be configured to selectively etch CSOD with some capping layer 502 (or liner) removal. Resist layer 602 may be removed using standard chemistry, such as oxygen plasma. In some embodiments, exposed liner 332 in periphery region 322 may be etched during the actions described in reference to FIG. 7. In some embodiments, exposed liner 332 in periphery region 322 may remain, as shown in FIG. 7. Post-etch cleaning may be applied to remove defects or particles as needed.

Figure 8:
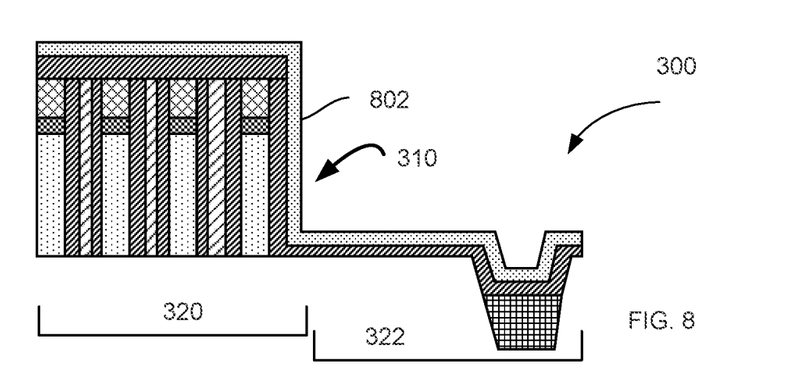

In FIG. 8, the memory device 300 is depicted subsequent to depositing array protection layer 802 on top of the memory and periphery regions 320 and 322, to protect exposed CSOD at edges of the array 310 and to further protect the rest of array 310 against potential film densification. Array protection layer 802 deposition may be accomplished by using any low temperature dielectric material that is capable of protecting the array against SOD densification. The materials may include SiN, oxide, high-k dielectric material, or the like.

Figure 9:
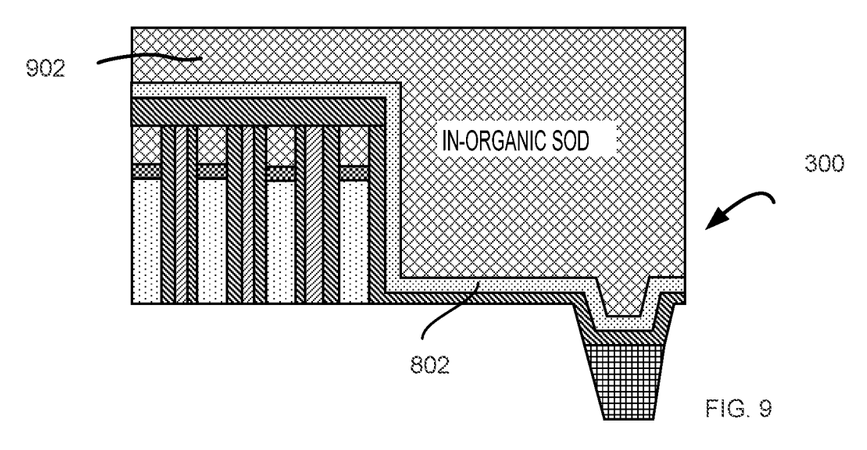

In FIG. 9, the memory device 300 is depicted subsequent to depositing inorganic dielectric material layer 902, such as inorganic SOD film, on top of the array protection layer 802. After deposition, the inorganic dielectric material layer 902 may be deposited, cured, and/or densified by using, for example, ultra-violet (UV) radiation, peroxide or temperature treatment.

Figure 10:
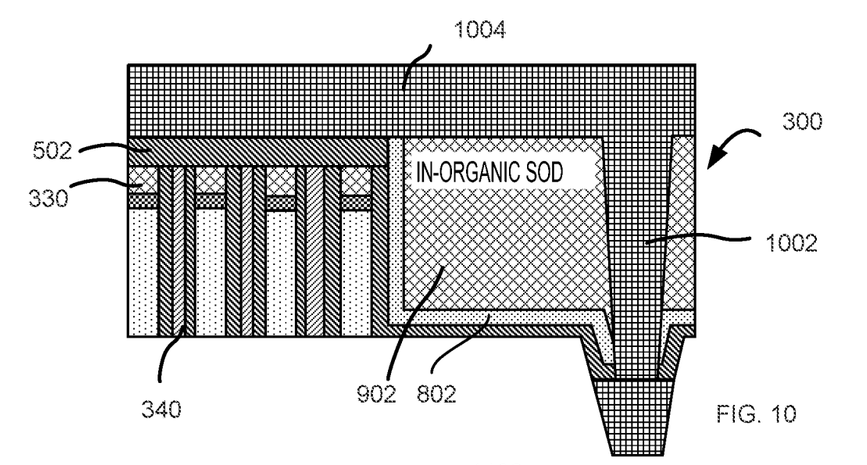

In FIG. 10, the memory device 300 is depicted subsequent to polishing (e.g., CMP) inorganic dielectric material layer 902 down to capping layer 502, followed by cleaning the polished surface, defining a via interconnect 1002, and filling the via interconnect 1002 (e.g., with metal, such as tungsten 1004. As a result of operations described in reference to FIGS. 1-10, the memory region 320 of the die 312 may be filled with the fill layer 340 (CSOD), and the periphery region 322 may be substantially filled with another fill layer that is different than CSOD, namely with inorganic dielectric material layer 902, for example.

Figure 11:
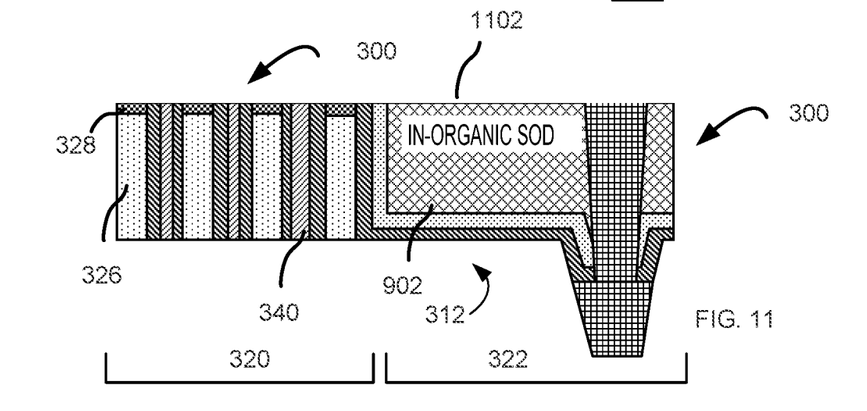

In FIG. 11, the memory device 300 is depicted subsequent to CMP-based removal of interconnect metal 1004, capping layer 502 (if present), and hard mask layer (e.g., silicon nitride) 330 (shown in FIG. 10) down to top carbon layer 328 of cell stack 326. CMP may be accomplished in multiple steps with cleans between the steps. In some embodiments, CMP may be accomplished in a single operation. Accordingly, as described above, the structural arrangement of the memory device 300 may include inorganic dielectric material layer 902 disposed in periphery region 322 and fill layer 340 (CSOD) disposed in the array 310 in the memory region 320 of the die 312 of the memory device 300. Subsequent steps of the process may involve, for example, depositing bitline material (e.g., tungsten) on top 1102 of the memory array 310 of FIG. 11, after wordline definition has been complete.

In some embodiments, the periphery region 322 of the die 312 of the memory device 300 may be filled with different types of dielectric material, other than inorganic SOD described above. The following descriptions provide examples of deposition of various types of dielectric material in the periphery region 322 of the die 312, while the memory region 320 may be filled with CSOD as described above.

Figure 12:
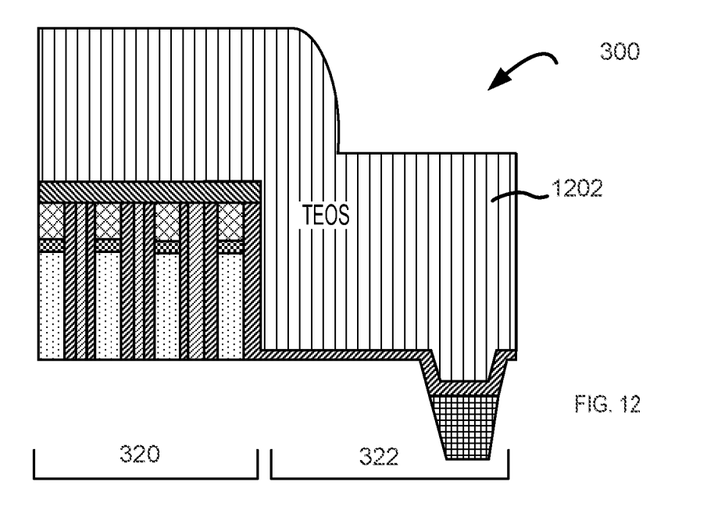
Figure 13:
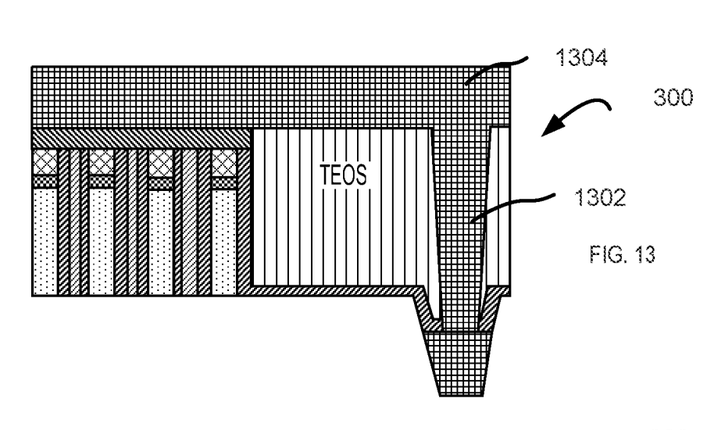
Figure 14:
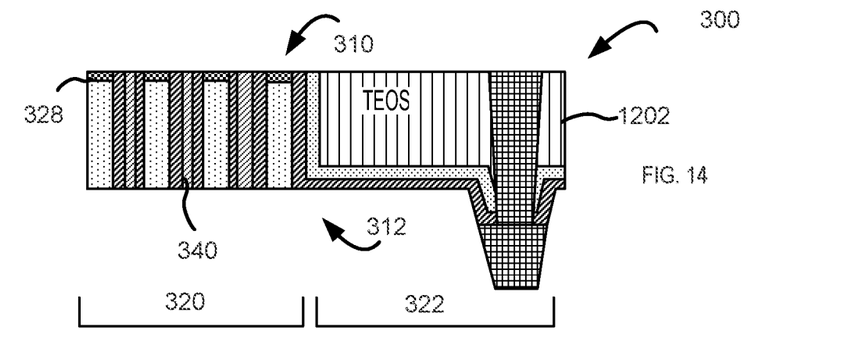

FIGS. 12-14 illustrate example embodiments in which the periphery region 322 of the die 312 of the memory device 300 may be filled with oxide dielectric material, and the memory region may be filled with CSOD as described in reference to FIGS. 3-7. Accordingly, the operations described in reference to FIGS. 12-14 may occur subsequent to the operations described in reference to FIG. 7. More specifically, the operations described in reference to FIGS. 12-14 may occur subsequent to the exposure of capping layer 502 on the memory array 310 of the device 300, and removal of the exposed fill layer 340 (CSOD) from the periphery region 322 of the die 312 of the device 300.

The oxide dielectric material to fill the periphery region 322 may include a low temperature oxide, for example, alkoxide compound material, such as, for example, tetraethyl orthosilicate (TEOS). For the process described in reference to FIGS. 12-14, no cure or densification operations may be required, and accordingly, no potential danger to damage the cell stack through cure or densification may be experienced.

In FIG. 12, the memory device 300 is depicted subsequent to post-CSOD periphery dry etching and cleaning, and filling the memory region 320 and periphery region 322 with standard CVD oxide dielectric material 1202 (e.g., TEOS). No array protection layer may be needed because no film cure or densification may be required for the CVD oxide dielectric material 1202 fill.

In FIG. 13, the memory device 300 is depicted subsequent to via interconnect 1302 definition and fill with metal material 1304, similar to the operations described in reference to FIG. 10.

In FIG. 14, the memory device 300 is depicted subsequent to planarization down to carbon layer 328 of the memory array 310, similar to the operations described in reference to FIG. 11. As a result of the processes described in reference to FIGS. 1-7 and 12-14, the periphery region 322 of the die of the memory device 300 may be filled with oxide dielectric material 1202 (e.g., TEOS), and the memory region 320 of the die 312 may be filled with fill layer 340 (CSOD).

In some embodiments, the fill layer 340 comprising CSOD may be disposed on the memory device 300 to extend to the periphery region 322 located outside of the memory array 310 and immediately adjacent to the memory region 320 of the die. The presence of CSOD in at least a portion of the periphery region may be achieved by the photo patterning operation described in reference to FIG. 6, in which the resist layer 602 may extend into a portion of the periphery region 322 of the die 312.

The provision of the CSOD layer in a portion of the periphery region 322 of the die of the memory device 300 may result in a reduction of alignment requirement for the resist layer 602, which may enable a cheaper photo option, compared to the one described in reference to FIG. 6. Further, dry etch margin may be improved by allowing more resist trim during CSOD removal without affecting the memory array 310 and exposing the cell stack 326. Also, there may be structural benefits for the memory array by having the same fill layer 340 (CSOD) on both sides of the outer wordline of the memory array 310 (e.g., wordline 308 facing the periphery region 322 in FIG. 3), in contrast to embodiments described above in which the CSOD may be disposed on the memory array 310 side and standard oxide material may be disposed on the periphery region 322 side of the die 312 of the memory device 300.

The example embodiments providing the deposition of the CSOD fill layer 340 in at least a portion of the periphery region of the die are described in reference to FIGS. 15-18. The operation of FIGS. 15-18 may follow the operations described in reference to FIG. 5, in which the capping layer 502 may be provided on top of periphery region 322 and memory region 320 of the die 312 of the memory device 300.

Figure 15:
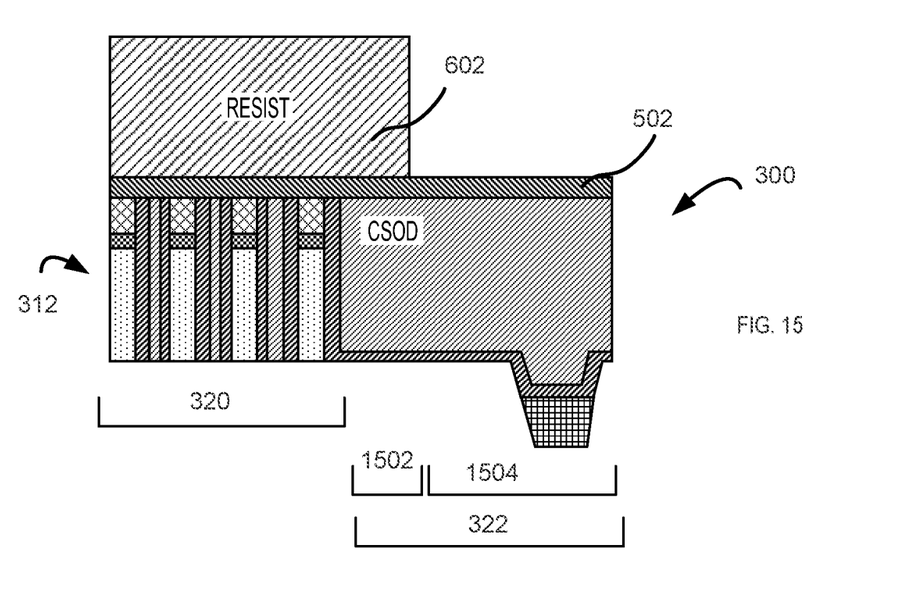

In FIG. 15, the memory device 300 is depicted subsequent to photo patterning of the memory array 310, which may result in a deposition of a resist layer 602 on top of the memory array 310, e.g., on top of the portion of capping layer 502 that substantially covers the memory region 320 of the die 312. As shown, the deposition of the resist layer 602 may extend to a portion 1502 of the periphery region 322 that may be located outside, and adjacent to, the memory array 310 and between the memory region 320 and a remaining portion 1504 of the periphery region 322.

Figure 16:
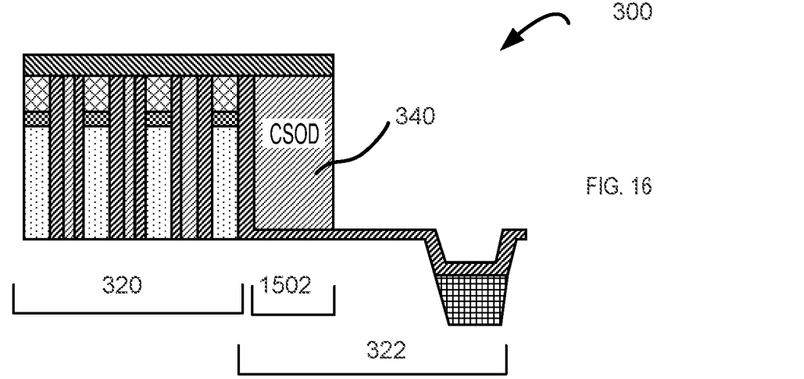

In FIG. 16, the memory device 300 is depicted subsequent to removing the fill layer 340 from the portion 1504 of the periphery region 322 of the die 312, similar to the operations described in reference to FIG. 7. As shown, the fill layer 340 (CSOD) may remain in the portion 1502 of the periphery region 322. In embodiments, array protection layer 802 may be disposed on top of the memory and periphery regions 320 and 322 (as shown in FIG. 17), similar to the operations described in reference to FIG. 8.

Figure 17:
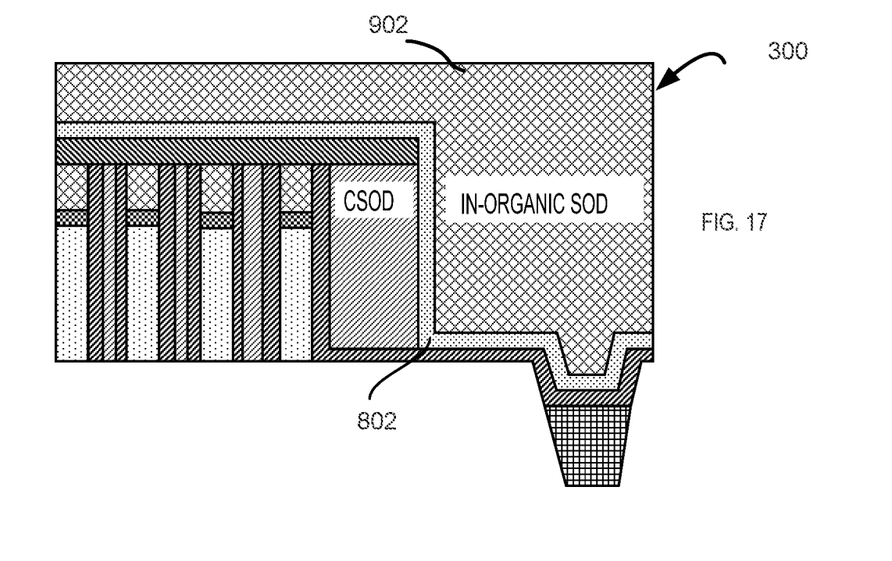

In FIG. 17, the memory device 300 is depicted subsequent to depositing inorganic dielectric material layer 902, such as inorganic SOD film, on top of the array protection layer 802, similar to the operations described in reference to FIG. 9. However, deposition of other fill layers, such as TEOS described in reference to FIGS. 12-14, may be provided instead.

Figure 18:
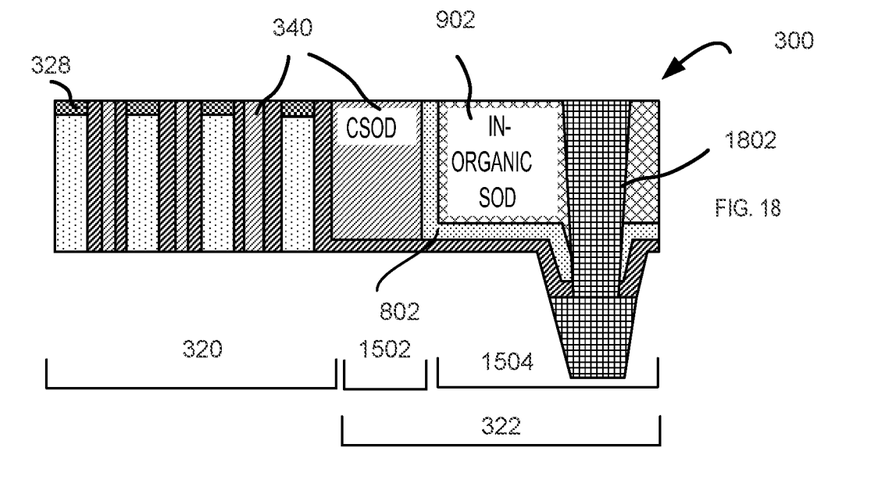

In FIG. 18, the memory device 300 is depicted subsequent to provision of via interconnect 1802 and CMP removal of interconnect metal 1004, capping layer 502 (if present), and hard mask layer 330 down to top carbon layer 328 of cell stack 326, similar to the operations described in reference to FIGS. 10-11. As a result of operations described in reference to FIGS. 15-18, the fill layer 340 (CSOD) may be disposed in the memory region 320 and a portion 1502 of the periphery region 322, adjacent to the memory region 320. Another fill layer (e.g., inorganic dielectric material layer 902) may be disposed in the remaining portion 1504 of the periphery region 322.

As shown, CSOD that fills the portion 1502 of the periphery region 322 may be disposed away from the interconnect 1802 disposed in the portion 1504 of the periphery region 322. In other words, the inorganic dielectric material layer 902 may be provided in the portion 1504 where the interconnect 1802 is formed, to avoid the risk of poor adhesion of the CSOD material to the interconnect if CSOD were to extend to the portion 1504 of the periphery region 322.

Figure 19:
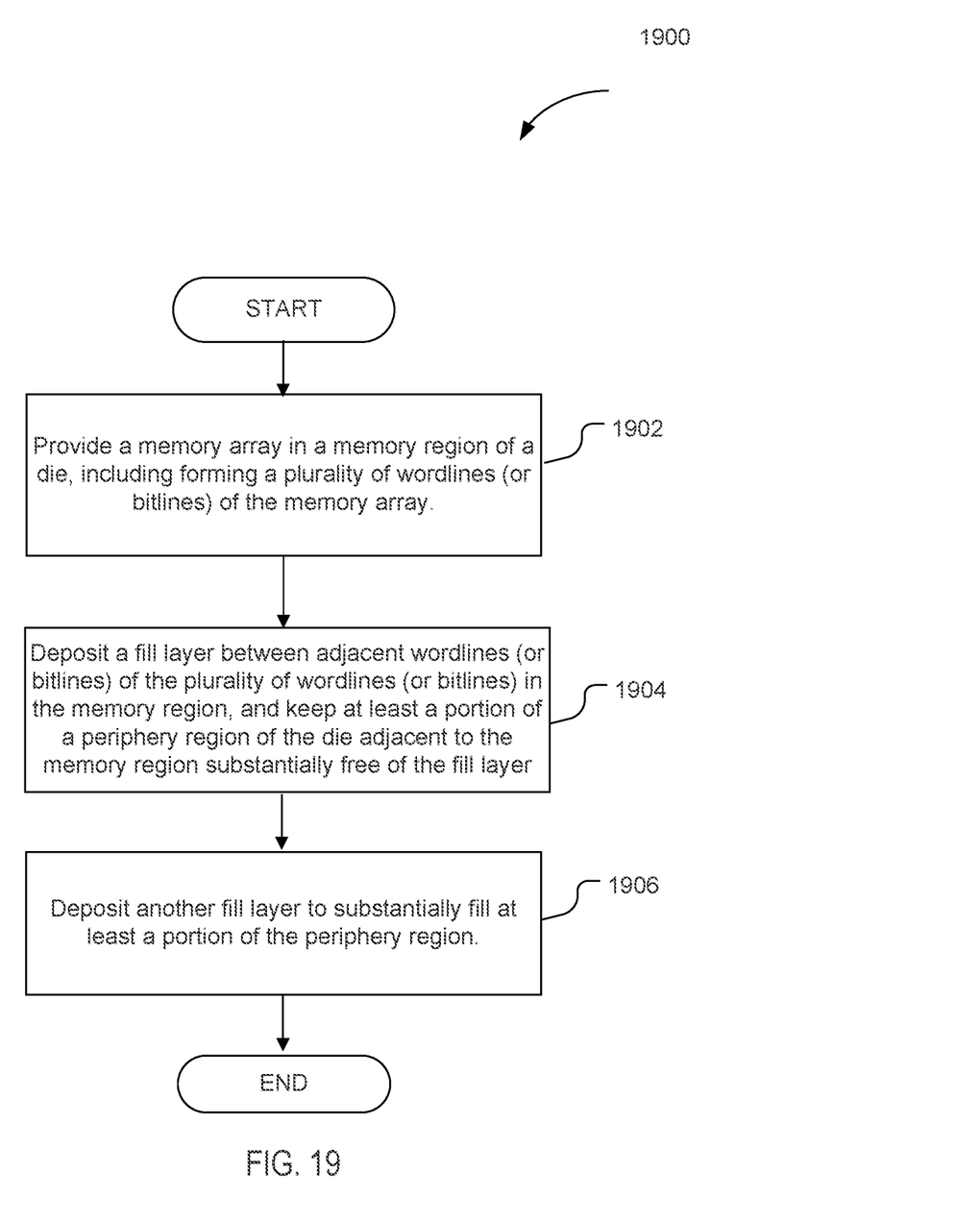
FIG. 19 is a process flow diagram for providing a memory array disposed in a die with an organic spin-on dielectric material disposed in a memory region of the die using techniques of the present disclosure, in accordance with some embodiments.

FIG. 19 is a process flow diagram for providing a memory array disposed in a die with an organic spin-on dielectric material disposed in a memory region of the die using techniques of the present disclosure, in accordance with some embodiments. The process 1900 may comport with actions described in connection with FIGS. 3-18 in some embodiments. As noted above, the process 1900 may apply to formation of wordlines or bitlines in a memory array in accordance with embodiments described herein. The application of the process 1900 to formation of wordlines is provided for purposes of illustration and for ease of understanding.

At block 1902, the process 1900 may include providing a memory array in a memory region of a die, including forming a plurality of wordlines of the memory array. Forming a plurality of wordlines may include various processes, such as dry etch, cleaning, deposition of a liner, and provision of a fill layer for structural integrity purposes. As a result, the wordlines may include a cell stack, a carbon layer, a hard mask layer (e.g., silicon nitride), and a sealing layer.

At block 1904, the process 1900 may further include depositing a fill layer between adjacent wordlines of the plurality of wordlines in the memory region, to provide structural integrity for the memory array, and keeping at least a portion of a periphery region of the die adjacent to the memory region substantially free of the fill layer. In some embodiments, the fill layer may comprise organic spin-on dielectric material (CSOD).

Depositing the fill layer may further include providing a sealing layer on the memory and periphery regions and depositing the fill layer on top of the sealing layer. The process may further include polishing the fill layer to substantially expose the wordlines, depositing a capping layer on top of the exposed wordlines of the memory region and on the periphery region, and depositing a resist layer on top of a portion of the capping layer that substantially covers the memory region, to protect the memory array. The process may further include etching the memory array to remove the resist layer from the memory region and substantially remove the fill layer from at least a portion of the periphery region.

At block 1906, the process 1900 may further include depositing another fill layer to substantially fill at least a portion of the periphery region. The other fill layer may be different than the fill layer deposited at block 1904. The other fill layer can be inorganic dielectric material or alkoxide compound material.

Various operations of the process 1900 are described as multiple discrete operations, in a manner that is most helpful in understanding the claimed subject matter. However, the order of description should not be construed as to imply that these operations are necessarily order dependent. It will be appreciated that the sequence of operations associated with the process 1900 may vary and/or include other actions in accordance with the present disclosure.

The memory arrays and methods described herein may be implemented into a system using any suitable hardware and/or software to configure as desired.

Figure 20:
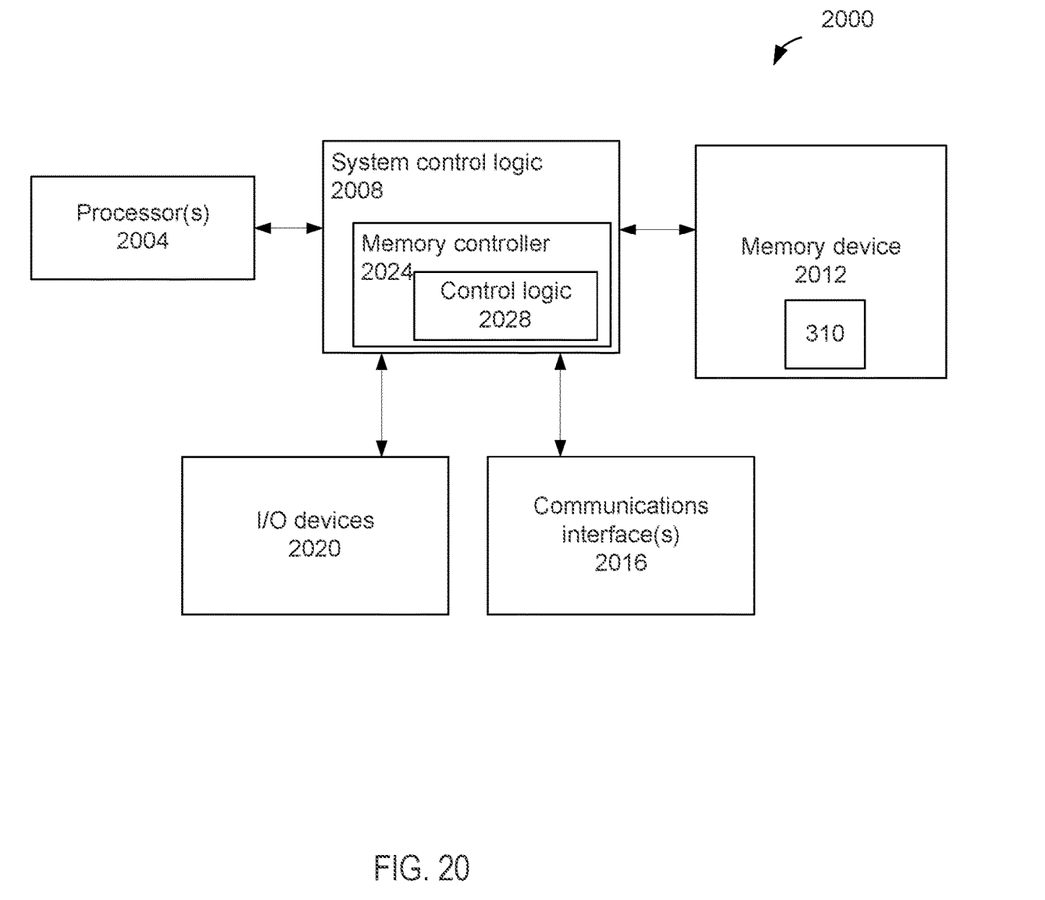
FIG. 20 schematically illustrates an example computing device including a memory array disposed in a die with an organic spin-on dielectric material disposed in a memory region of the die using techniques of the present disclosure, in accordance with some embodiments.

FIG. 20 schematically illustrates an example computing device including a memory array disposed in a die with an organic spin-on dielectric material disposed in a memory region of the die using techniques of the present disclosure, in accordance with some embodiments. The computing device 2000 may include system control logic 2008 coupled to one or more processor(s) 2004; a memory device 2012 having a memory array 310 described in reference to FIGS. 3-18; one or more communications interface(s) 2016; and input/output (I/O) devices 2020.

The memory device 2012 may be a non-volatile computer storage chip (e.g., provided on the die 102 of FIGS. 1-2) that may include the memory device 300 of FIGS. 3-18. In embodiments, the memory device 2012 may comprise a package, such as IC assembly 200 of FIG. 2, having the memory device 300 disposed therein, driver circuitry (e.g., drivers), input/output connections to electrically couple the memory device 2012 with other components of the computing device 2000, etc. The memory device 2012 may be configured to be removably or permanently coupled with the computing device 2000. The memory device 2012 may include a memory array 310 described in reference to FIGS. 3-18. The memory array 310 may include an organic spin-on dielectric material disposed in a memory region of the die using the techniques described with reference to FIG. 19.

Communications interface(s) 2016 may provide an interface for computing device 2000 to communicate over one or more network(s) and/or with any other suitable device. Communications interface(s) 2016 may include any suitable hardware and/or firmware. Communications interface(s) 2016 for one embodiment may include, for example, a network adapter, a wireless network adapter, a telephone modem, and/or a wireless modem. For wireless communications, communications interface(s) 2016 for one embodiment may use one or more antennas to communicatively couple the computing device 2000 with a wireless network.

For one embodiment, at least one of the processor(s) 2004 may be packaged together with logic for one or more controller(s) of system control logic 2008. For one embodiment, at least one of the processor(s) 2004 may be packaged together with logic for one or more controllers of system control logic 2008 to form a System in Package (SiP). For one embodiment, at least one of the processor(s) 2004 may be integrated on the same die with logic for one or more controller(s) of system control logic 2008. For one embodiment, at least one of the processor(s) 2004 may be integrated on the same die with logic for one or more controller(s) of system control logic 2008 to form a System on Chip (SoC).

System control logic 2008 for one embodiment may include any suitable interface controllers to provide for any suitable interface to at least one of the processor(s) 2004 and/or to any suitable device or component in communication with system control logic 2008. The system control logic 2008 may move data into and/or out of the various components of the computing device 2000.

System control logic 2008 for one embodiment may include a memory controller 2024 to provide an interface to the memory device 2012 to control various memory access operations. The memory controller 2024 may include control logic 2028 that may be specifically configured to control access of the memory device 2012.

In various embodiments, the I/O devices 2020 may include user interfaces designed to enable user interaction with the computing device 2000, peripheral component interfaces designed to enable peripheral component interaction with the computing device 2000, and/or sensors designed to determine environmental conditions and/or location information related to the computing device 2000. In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard. In various embodiments, the peripheral component interfaces may include, but are not limited to, a non-volatile memory port, an audio jack, and a power supply interface. In various embodiments, the sensors may include, but are not limited to, a gyro sensor, an accelerometer, a proximity sensor, an ambient light sensor, and a positioning unit. The positioning unit may additionally/alternatively be part of, or interact with, the communication interface(s) 2016 to communicate with components of a positioning network, e.g., a global positioning system (GPS) satellite.

In various embodiments, the computing device 2000 may be a mobile computing device such as, but not limited to, a laptop computing device, a tablet computing device, a netbook, a smartphone, etc.; a desktop computing device; a workstation; a server; etc. The computing device 2000 may have more or fewer components, and/or different architectures. In further implementations, the computing device 2000 may be any other electronic device that processes data.

According to various embodiments, the present disclosure describes a number of examples. Example 1 is an apparatus, comprising: a memory array having a plurality of wordlines disposed in a memory region of a die; and a fill layer deposited substantially between adjacent wordlines of the plurality of wordlines, to provide structural integrity for the memory array, wherein at least a portion of a periphery region of the die adjacent to the memory region is substantially free of the fill layer.

Example 2 may include the subject matter of Example 1, wherein the fill layer comprises organic spin-on dielectric material (CSOD).

Example 3 may include the subject matter of Example 1, wherein the at least a portion of the periphery region that is substantially free of the fill layer is a first portion, wherein the periphery region includes a second portion located outside the memory array and between the memory region and the first portion, wherein the second portion is substantially filled with the fill layer.

Example 4 may include the subject matter of Example 3, wherein the fill layer is a first fill layer, wherein the first portion of the periphery region is substantially filled with a second fill layer that is different than the first fill layer.

Example 5 may include the subject matter of Example 1, wherein the fill layer is a first fill layer, wherein the periphery region is substantially filled with a second fill layer that is different than the first fill layer.

Example 6 may include the subject matter of Example 5, wherein the periphery region includes one or more vias disposed in the second fill layer to provide electrical connectivity for the memory array with circuitry associated with the memory array.

Example 7 may include the subject matter of Example 5, wherein the second fill layer is selected from one of: inorganic dielectric material or alkoxide compound material.

Example 8 may include the subject matter of Example 7, wherein the alkoxide compound material includes tetraethyl orthosilicate (TEOS).

Example 9 may include the subject matter of Example 1, wherein the apparatus further comprises: a sealing layer disposed on the memory and periphery regions; and a capping layer disposed on top of the wordlines of the memory region and on the periphery region.

Example 10 may include the subject matter of Example 1, further comprising a plurality of bitlines disposed in the die with the fill layer to fill gaps between adjacent bitlines, to further provide structural integrity for the memory array.

Example 11 may include the subject matter of any of Examples 1 to 10, wherein the memory array is a three-dimensional (3D) memory array.

Example 12 may include the subject matter of Example 11, wherein the apparatus comprises an integrated circuit.

Example 13 is an apparatus, comprising: a processor; and a memory coupled with the processor, wherein the memory includes a memory array having a plurality of wordlines disposed in a memory region of a die, and a first fill layer deposited between adjacent wordlines of the plurality of wordlines in the memory region, to provide structural integrity for the memory array, wherein at least a portion of a periphery region of the die adjacent to the memory region is substantially filled with a second fill layer that is different than the first fill layer.

Example 14 may include the subject matter of Example 13, wherein the first fill layer comprises organic spin-on dielectric material (CSOD).

Example 15 may include the subject matter of Example 13, wherein the second fill layer is selected from one of; inorganic dielectric material or alkoxide compound material.

Example 16 may include the subject matter of Example 13, wherein the at least a portion of a periphery region of the die adjacent to the memory region is further filled with the first fill layer in an area of the portion that is directly contiguous with the memory region.

Example 17 may include the subject matter of Example 13, wherein the memory array is a cross-point memory array.

Example 18 may include the subject matter of any of Examples 13 to 17, wherein the apparatus is a mobile computing device.

Example 19 is a method for providing a memory array with structural integrity, comprising: providing a memory array in a memory region of a die, including forming a plurality of wordlines of the memory array; and depositing a fill layer between adjacent wordlines of the plurality of wordlines in the memory region, to provide structural integrity for the memory array, wherein depositing includes keeping at least a portion of a periphery region of the die adjacent to the memory region substantially free of the fill layer.

Example 20 may include the subject matter of Example 19, wherein depositing a fill layer between adjacent wordlines and keeping at least a portion of a periphery region of the die adjacent to the memory region substantially free of the fill layer includes: providing a sealing layer on the memory and periphery regions; depositing the fill layer on top of the sealing layer; polishing the fill layer to substantially expose the wordlines; depositing a capping layer on top of the exposed wordlines of the memory region and on the periphery region; depositing a resist layer on top of a portion of the capping layer that substantially covers the memory region, to protect the memory array, and etching the memory array to remove the resist layer from the memory region and substantially remove the fill layer from the at least a portion of the periphery region.

Example 21 may include the subject matter of Example 20, wherein the fill layer is a first fill layer, wherein the method further comprises: depositing a second fill layer to substantially fill the at least a portion of the periphery region, wherein the second fill layer is different than the first fill layer.

Example 22 may include the subject matter of Example 21, wherein the first fill layer comprises organic spin-on dielectric material (CSOD).

Example 23 may include the subject matter of Example 22, wherein depositing a second fill layer to substantially fill the at least a portion of the periphery region includes depositing at least one of: inorganic dielectric material or alkoxide compound material.

Example 24 is an apparatus, comprising: means for providing a memory array in a memory region of a die, including forming a plurality of wordlines of the memory array; and means for depositing a fill layer between adjacent wordlines of the plurality of wordlines in the memory region, to provide structural integrity for the memory array, wherein the means for depositing includes means for keeping at least a portion of a periphery region of the die adjacent to the memory region substantially free of the fill layer.

Example 25 may include the subject matter of example 24, wherein the means for depositing a fill layer between adjacent wordlines and keeping at least a portion of a periphery region of the die adjacent to the memory region substantially free of the fill layer includes: means for providing a sealing layer on the memory and periphery regions; means for depositing the fill layer on top of the sealing layer; means for polishing the fill layer to substantially expose the wordlines; means for depositing a capping layer on top of the exposed wordlines of the memory region and on the periphery region; means for depositing a resist layer on top of a portion of the capping layer that substantially covers the memory region, to protect the memory array; and means for etching the memory array to remove the resist layer from the memory region and substantially remove the fill layer from the at least a portion of the periphery region.

Example 26 may include the subject matter of Example 25, wherein the fill layer is a first fill layer, wherein the apparatus further comprises: means for depositing a second fill layer to substantially fill the at least a portion of the periphery region, wherein the second fill layer is different than the first fill layer.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to specific implementations disclosed in the specification and the claims. Rather, the scope is to be determined entirely by the following claims, which are to be construed in accordance with established doctrines of claim interpretation.

What is claimed is:

1. An apparatus, comprising:
   a memory region that includes a plurality of wordlines disposed adjacent each other, the wordlines having first sides and second sides opposite the first sides, wherein the first sides of the wordlines define a plane in a die, wherein the plurality of wordlines form a memory array;
   a periphery region disposed adjacent to the memory region, wherein the periphery region includes a first side and a second side opposite the first side, wherein the first side of the periphery region further defines the plane of the die;
   a first fill layer deposited substantially between adjacent wordlines of the plurality of wordlines, to provide structural integrity for the memory array; and
   a second fill layer deposited in the periphery region to substantially fill at least a portion of the periphery region, wherein the second fill layer covers the first side of the at least a portion of the periphery region, wherein the second fill layer comprises inorganic dielectric material.

2. The apparatus of claim 1, wherein the first fill layer comprises organic spin-on dielectric material (CSOD).

3. The apparatus of claim 1, wherein the at least a portion of the periphery region comprises a first portion, wherein the periphery region includes a second portion located outside the memory array and between the memory region and the first portion, wherein the second portion is substantially filled with the first fill layer.

4. The apparatus of claim 1, wherein the periphery region is separated from the memory region by an array protection layer, which extends into the first side of the periphery region.

5. The apparatus of claim 1, wherein the periphery region includes one or more vias disposed in the second fill layer to provide electrical connectivity for the memory array with circuitry associated with the memory array.

6. The apparatus of claim 1, wherein the apparatus further comprises:
   a sealing layer disposed on the memory and periphery regions; and
   a capping layer disposed on top of the wordlines of the memory region and on the periphery region.

7. The apparatus of claim 1, further comprising a plurality of bitlines disposed in the die with the first fill layer to fill gaps between adjacent bitlines, to further provide structural integrity for the memory array.

8. The apparatus of claim 1, wherein the memory array comprises a three-dimensional (3D) memory array.

9. The apparatus of claim 1, wherein the apparatus comprises an integrated circuit.

* * * * *